United States Patent [19]
Tiittanen et al.

[11] Patent Number: 5,371,481
[45] Date of Patent: Dec. 6, 1994

[54] TUNING TECHNIQUES FOR I/Q CHANNEL SIGNALS IN MICROWAVE DIGITAL TRANSMISSION SYSTEMS

[75] Inventors: Erkki Tiittanen; Heikki Mattila; Tapio Rautava; Jorma Matero, all of Oulu, Finland; Kjell Ostman, San Diego, Calif.; Mikko Halttunen, Oulu, Finland

[73] Assignee: Nokia Mobile Phones Ltd., Salo, Finland

[21] Appl. No.: 36,631

[22] Filed: Mar. 24, 1993

[51] Int. Cl.⁵ .................................... H04L 27/36
[52] U.S. Cl. ...................... 332/103; 375/39; 375/60; 455/126
[58] Field of Search ............ 332/103, 104, 105; 375/39, 60; 455/126

[56] References Cited
U.S. PATENT DOCUMENTS

| | | | |
|---|---|---|---|
| 4,700,151 | 10/1987 | Nagata | 455/126 |
| 5,012,208 | 4/1991 | Makinen et al. | 332/103 |
| 5,021,753 | 6/1991 | Chapman | 332/103 |
| 5,293,407 | 3/1994 | Shibata | 332/103 |

*Primary Examiner*—Andrew M. Dolinar
*Attorney, Agent, or Firm*—Perman & Green

[57] ABSTRACT

Structure and technique, for calibrating a vector modulator that does not require a network analyzer, are disclosed which are incorporated in a vector modulation system comprising a standard vector modulator circuit including means for shifting phase to adjust the relative phases of the I and Q components of the modulated RF carrier. Means for attenuating are included in the I and Q modulation system to adjust the relative amplitude of the modulation signals. The disclosure describes a technique wherein the microwave transmitter's I and Q phase difference is measured by measuring the power levels of the I and the Q signals. The power levels are compared and a correction value is stored in a read-only memory to compensate for the error. More particularly, the error compensation is achieved by first determining amplitude error or unbalance by I and Q signal power measurement and an amplitude compensation signal is stored, then a power measurement is carried out for phase compensation and a phase compensation signal is stored.

7 Claims, 2 Drawing Sheets

TUNING TECHNIQUES FOR I/Q CHANNEL SIGNALS IN MICROWAVE DIGITAL TRANSMISSION SYSTEMS

FIELD OF THE INVENTION

The present invention relates to vector modulation systems, and more particularly to vector modulation systems including I/Q modulators and tuning techniques therefor.

BACKGROUND OF THE INVENTION

Microwave communications using digital modulation techniques require signal modulators which perform vector or quadrature modulation. In vector modulation two modulation input signals independently modulate the in-phase (I) and quadrature (Q) components of the carrier. For proper operation, the I and Q channels of the modulator must be calibrated to be equal in gain, i.e., balanced, and precisely 90° apart, i.e., in quadrature.

One way to calibrate a vector modulator is with a network analyzer connected to the RF carrier input and to the RF modulated output. The network analyzer measures the amplitude and phase of the RF modulated output resulting from varying DC voltages applied to the I and Q modulation inputs. From these measurements, the gain and phase accuracy of the modulator can be determined, and calibrated. This is an expensive and complicated technique that is also limited in accuracy.

Structure and techniques for calibrating a vector modulator that does not require a network analyzer, are provided by the present invention and incorporated in a system comprising a standard vector modulator circuit including means for shifting phase to adjust the relative phases of the I and Q components of the modulated RF carrier. Means for variable attenuating are included in the I and Q modulation system to adjust the relative amplitude of the modulation signals.

The present invention provides a technique wherein the microwave transmitter's I and Q phase difference is measured by measuring the power levels of the I and the Q modulation signals. The power levels are compared and a correction value is stored in a read-only memory to compensate for the error.

More particularly, the error compensation is achieved by first determining amplitude error or unbalance by I and Q signal power measurement and an amplitude compensation signal is stored, then a power measurement is carried out for phase compensation and a phase compensation signal is stored. The amplitude and phase compensation signals are used to modify the I/Q digital input signals.

An object of the present invention is to provide an improved vector modulator having compensation of amplitude and phase errors by digital signal processing.

Another object of the present invention is to provide an improved vector modulator wherein the modulator is tuned by stored computed correction values.

A further object of the present invention is to provide a vector modulator wherein correction signals are generated by measuring the power of the modulator output signal and comparing them to stored correction values.

DESCRIPTION OF THE PREFERRED EMBODIMENT

Figure 1:
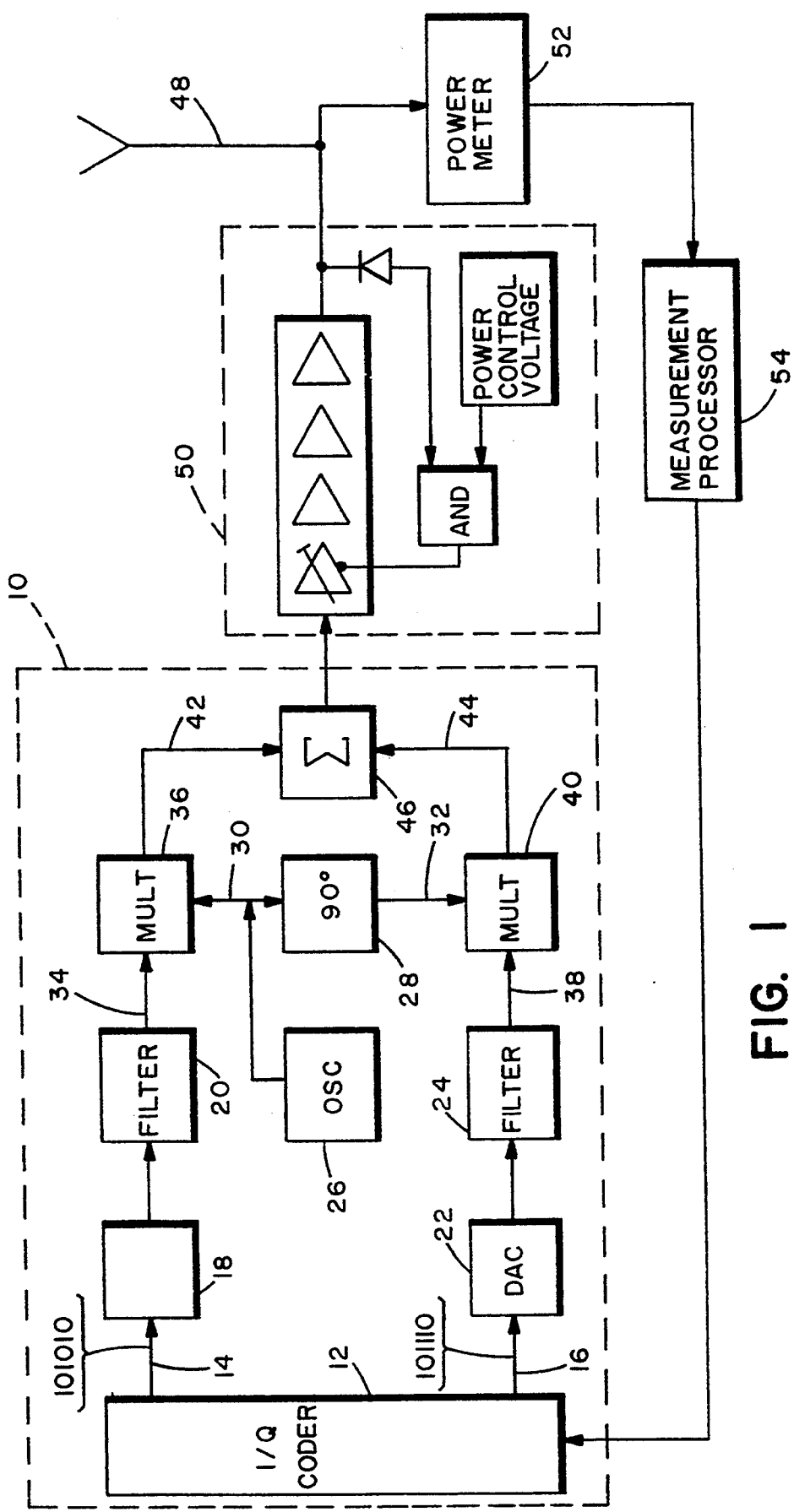
FIG. 1 is a schematic block diagram illustrating a vector modulator system including phase compensation according to the principles of the present invention.
Figure 2:
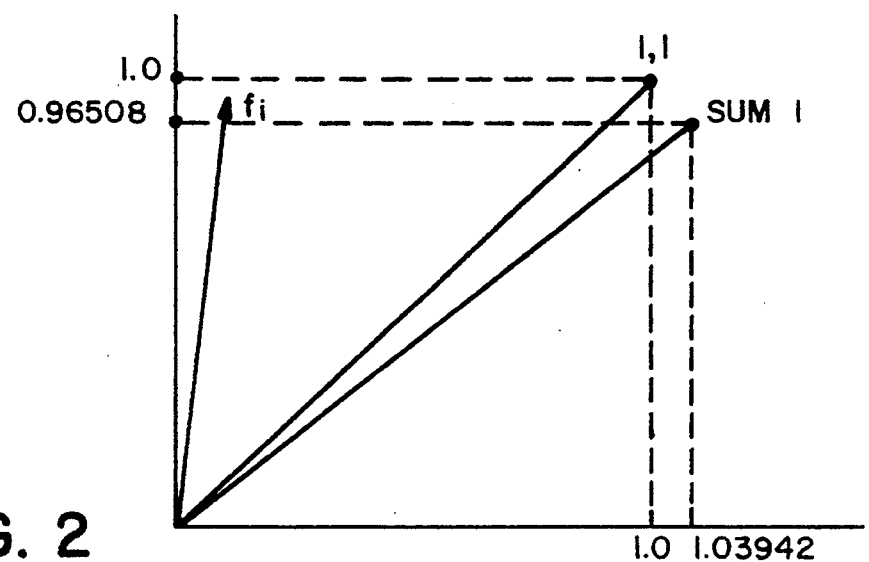
FIG. 2 is a diagram illustrating the effect of phase error on the I and Q signal components of the vector modulator.

Referring to FIG. 1, a vector modulator is shown which includes the improvements of the present invention. A vector modulator, which is also referred to as an I/Q modulator, is employed in microwave transmitters such as used in cellular telephones. A vector modulator applies two separate modulation signals to modulate the in-phase (I) and quadrature (Q) components of a carrier signal. A typical system used in the art is designated 10 in FIG. 1 and includes an I/Q encoder 12 that generates a first (I) digital signal on lead 14 and a second (Q) digital signal on lead 16. The I digital signal on lead 14 is converted to an analog signal by digital-to-analog converter (DAC) 18 and the analog signal is smoothed by baseband filter 20. Likewise, the Q digital signal on lead 16 is changed to an analog signal at digital-to-analog converter (DAC) 22 and smoothed at baseband filter means 24.

An RF carrier signal is generated by local oscillator 26 and is divided by a 90 degree power divider means 28 to provide an in-phase I signal component on lead 30 and a +90 degree quadrature Q signal component on lead 32.

The analog I component signal from filter 20 on lead 34 modulates the I component of the carrier signal on lead 30 at multiplier 36. Likewise, the analog Q component signal on lead 38 modulates the Q component of the carrier signal from filter 24 on lead 32 at multiplier 40. The modulated I and Q carrier signals on leads 42 and 44 are combined by a 0 degree power combiner 46 to produce the vector modulated RF output signal that is transmitted via antenna 48 after being passed through a power control unit 50.

As previously stated, the I/Q modulator described is known and documented in the art.

According to the principles of the present invention, the output power of selected frequencies of the RF output signal at antenna 48 are measured by a narrow band power meter 52. The outputs of the narrow band power meter 52, which will be more fully described as explained, are applied to a measurement processor 54 which calculates the desired corrections to any amplitude and phase errors of the I and Q signals and transmits a correction signal to the I/Q coder 12 to calibrate or tune the modulator system.

Amplitude balance of a quadrature or vector modulator used in digital mobile phone technology can be achieved by tuning. Conventionally in the prior art, tuning is carried out by the use of a trimmer resistor. In the present invention the tuning is done by using digital techniques. The I and Q signals used in vector modulators are digital signals generated by coding circuits and the amplitude of the signals can therefore effectively be tuned by digital correction signals.

By the present invention both the gain and the difference of the I and Q branches due to DACs, filters, mixers, and summer can be compensated for, and amplitude differences of quadrature carriers caused by temperature changes can also be corrected.

The amplitude tuning values can be stored in memory circuits such as electrically erasable programmable read-only memories (EEPROMs).

The tuning process for the error compensation initially includes measuring the power levels of the I signal component and the Q signal component with the default I/Q coordinates (0,±1, ±√2. Then a correction term is summed to the I- and Q-coordinates so that resulting vector, despite the phase error, is correct. The phase error (90 degrees minus the actual phase between the I and Q components is increased in steps of one degree so the error vectors will be, for example, as follows:

| I | Q | error (fi) | resulting*) error vector | New I-coord. | New Q-coord. |
|---|---|---|---|---|---|
| 1 | 1 | 1° | 0.01745-j0.00015 | 0.98255 | 1.00015 |
|   |   | 2° | 0.03492-j0.00061 | 0.96508 | 1.00061 |

*)(tan(fi) − j*(1-cos(fi))
real part = I, Imaginary part = Q
... and so on.

If the power level difference becomes smaller, the direction of the phase error is in the other direction and the previous example would now be:

| I | Q | error (fi) | resulting*) error vector | New I-coord. | New Q-coord. |
|---|---|---|---|---|---|
| 1 | 1 | −1° | −0.01745-j0.00015 | 1.01745 | 1.00015 |
|   |   | −2° | −0.03492-j0.00061 | 1.03492 | 1.00061 |

The power level measurement information from narrow band power meter 52 is transmitted via a data bus to the data processor 54.

In the system shown in FIG. 1, the vector modulation section 10 employs known prior art encoding and vector modulation techniques and transmitter voice-signal processing stages. The voice encoded I and Q signal components, consisting of zero to one and one to zero transitions are applied to the respective digital to analog converters (DACs) 18 and 22 to produce wide band analog signals which are applied to base band filters 20 and 24, the outputs of which are used to modulate the I and Q components of the carrier signal on leads 30 and 32.

The modulation method used is known in the art as $\pi/4$ shifted differentialy encoded quadrature phase shift keying.

In the $\pi/4$ shift differential quadrature phase shift keying technique, the modulation of the carrier consists of a cosine component and a sine component. The cosine component of the signal vector is the in-phase or I signal and the sine component of the signal vector is the quadrature, or Q signal.

The I and Q signal vector components are mixed with the I and Q components of the carrier signal and summed to create the transmission signal. Signals representing the vector components I and Q of the phase shift of the signal vector are generated by shifting the signal vector such that phase shifts of the carrier of $\pm 3\pi/4$ radians are generated. Each phase shift ($-3\pi/4$, $+3\pi/4$, $+\pi/4$, $-\pi/4$) encodes one of four possible signals.

Figure 3:
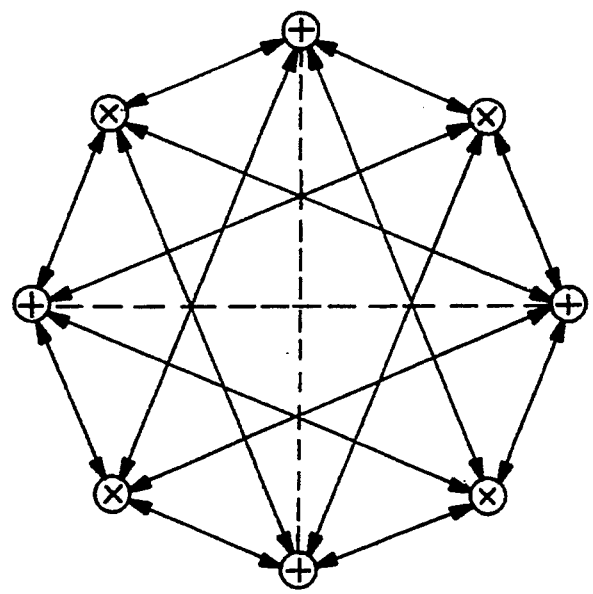
FIG. 3 is an illustration of a phase constellation used in this explanation of the present invention.

The modulation scheme uses the phase constellation shown in FIG. 3. Note that Gray code is used in the mapping: two di-bit symbols corresponding to adjacent signal phases differ only in a single bit. Since most probable errors due to noise result in the erroneous selection of an adjacent phase, most di-bit symbol errors contain only a single bit error.

Note also, the rotation by $\pi/4$ of the basic QPSK constellation for odd (denoted ⊕) and even (denoted ⊕) symbols.

Figure 4:
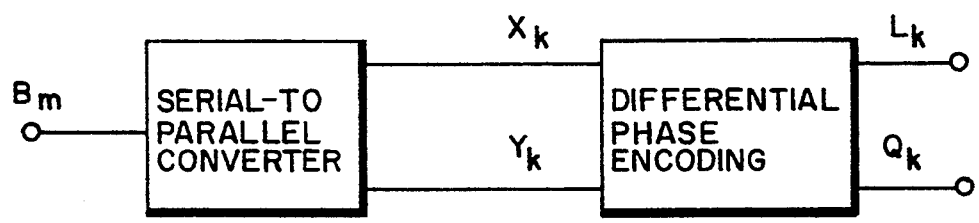
FIG. 4 is a schematic block diagram of a differential encoder employed in the embodiment of the present invention.

In $\pi/4$ modulation the information is differentially encoded, that is, the symbols are transmitted as changes in phase rather than absolute phases. A block diagram of the differential encoder is shown in FIG. 4. The binary data stream entering the modulator $b_m$, is converted by a serial-to-parallel converter into two separate binary streams ($X_k$) and ($Y_k$). Starting from bit 1 in time of stream $b_m$, all odd numbered bits form stream $X_k$ and all even numbered bits form stream $Y_k$.

The digital data sequences ($X_k$) and ($Y_k$) are encoded onto ($I_k$) and ($Q_k$) according to:

$$I_k = I_{k-1} \cos [\Delta\Phi(X_k, Y_k)] - Q_{k-1} \sin [\Delta\Phi(X_k, Y_k)]$$

$$Q_k = I_{k-1} \sin [\Delta\Phi(X_k, Y_k)] + Q_{k-1} \cos [\Delta\Phi(X_k, Y_k)]$$

where Ik. $Q_{k-1}$ are the amplitudes at the previous pulse time and k is an index of the bit pairs. The phase change $\Delta\Phi$ is determined according to the following table:

| $X_k$ | $Y_k$ | $\Delta\Phi$ |
|---|---|---|
| 1 | 1 | $-3\pi/4$ |
| 0 | 1 | $3\pi/4$ |
| 0 | 0 | $\pi/4$ |
| 1 | 0 | $-\pi/4$ |

The signals $I_k$, $Q_k$ at the output of the differential phase encoding means in FIG. 4 can take one of five values. 0, ±1, ±1√2, resulting in the constellation shown in FIG. 3.

Pulses $I_k$, $Q_k$ from the I/Q coder 12 of FIG. 1 are converted to analog signals by DACs 18 and 22 and are applied to the inputs of the I & Q base-band filters 20 and 24. The base-band filters have linear phase and square root raised cosine frequency response of the form:

$$\begin{cases} 1 \\ \sqrt{\frac{1}{2}\left\{1 - \sin\left[\frac{\pi(2fT-1)}{2a}\right]\right\}} \\ 0 \end{cases}$$

where T is the symbol period. The roll-off factor, a, determines the width of the transition band.

The resultant transmitted signal s(t) from power combiner 46 in FIG. 1 is given by:

$$s(t) = \Sigma g(t-nT) \cos \Phi_n \cos \omega_c t - \Sigma g(t-nT) \sin \Phi_n \cos \omega_c t$$

where g(t) is the pulse shaping function, $w_c$ is the radian carrier frequency. T is the symbol period, and $\Phi_n$ is the absolute phase corresponding to the $n^{th}$ symbol interval.

The $\Phi_n$ which results from the differential encoding is:

$$\Phi_n = \Phi_{n-1} + \Delta\Phi_n.$$

Any method which generates the specified s(t) using the cited phase table may be used.

The sequence of operations for a typical example of I/Q tuning according to the present invention is as follows:

1. Initial transmitter settings
   mode: digital
   channel 300 (Fo=834 MHz)
   TX power level 0
   set AFC to the previously tuned analog AFC value
   value for phase compensation is loaded in the processor in the beginning
   value for amplitude compensation is loaded in the processor in the beginning
   value for amplitude level is loaded in the processor in the beginning
   continuous transmission on
   modulating symbols 1-chain
2. Measuriing
   measure the narrow band RF-power using 2.5 kHz filter power meter on antenna connector
3. Local Sequence
   Modulator Tuning
      provide compensation values for:
         amplitude level
         amplitude compensation
         phase compensation
   Continuous Transmission
4. Adjustment
   1. Set Scale factor (36.0 dBm)
   2. Amplitude
      Measure the power levels on the carrier frequency of Fo−9.1125 kHz and Fo+9.1125 kHz. Compare the levels. SSB attenuation (level difference) should be as big as possible, so that Fo−9.1125 kHz level is higher. Adjust and load amplitude compensation value and repeat measurement. This is repeated till maximum SSB-attenuation has been achieved. Store value to EEPROM in meaurement processor.
   3. Phase compensation
      Measure SSB attenuation as described in 2. Adjust and load new value for phase compensation and repeat measurements on the two mentioned frequencies. The phase compensation value will be adjusted till maximum SSB attenuation has been achieved. After these two compensations SSB-attenuation must be >32 dB. Store value to EEPROM in the measurement processor.
   4. Modulator output level
      Decrease/load amplitude level value to transmitter unit and measure RF-power (BW>30 kHz). This is repeated till RF-power drops 0.5 dB (35.5 dBm) below 36.0 dBm.
      When this level has been achieved, increase both compensation values (I & Q) with a multiplier, which corresponds 1.5 dB increase in ITX and QTX signal amplitudes. Store scale factor to EEPROM.

As an extension of the normal power control of the transmitter the output power can also be tuned by amplitudes of I and Q signals. This can be necesary when the power control window is too narrow.

Because of tolerances of components and variations of temperature, the power control could run out in high end or low end of output power. This problem can be solved using the present invention.

In production the position of the power control window is tuned by I and Q amplitudes. This tuning compensates the variations of the position of the power control window caused by the tolerances of the components.

After production tuning when the system is in use in a mobile phone, if the TX power control runs out caused by temperature or aging, the output power can be tuned by I and Q amplitudes.

What has been described is an improved vector modulator wherein phase error is compensated by digital signal processing and the modulator is toned by stored computed values. The correction signals for the phase error is determined by measuring the power level from the modulator output.

While the invention has been particularly shown and described with respect to a preferred embodiment thereof, it will be understood by those skilled in the art that changes in form and details may be made therein without departing from the scope and spirit of the invention.

What is claimed is:

1. In a vector modulation system of the type including an I/Q digital encoder means for providing a digital signal for the in-phase I component of a data signal and a digital signal for the quadrature Q component of the data signal, digital-to-analog converter means for converting the digital I and Q data signals to analog I and Q data signals, a vector path for the in-phase I analog data signal component and a vector path for the quadrature Q analog data signal component, modulating means for modulating an in-phase I component of a carrier signal by the I component analog data signal and for modulating a quadrature Q component of a carrier signal by the Q component analog data signal, means for combining the I and Q modulated carrier signal components into one signal, and antenna means for transmitting the said combined I and Q modulated carrier signal, the improvement characterized in a tuning means for the vector modulation system comprising:

a power meter means for measuring the output power of selected frequencies of the said combined I and Q modulated carrier signal from said antenna to provide the amplitude and phase difference between the said modulated I and Q carrier signal components, means responsive to said power meter means for generating an amplitude compensation signal corresponding to errors in amplitude of said I and Q modulated carrier signal components and means responsive to said power meter means for generating a phase compensation signal corresponding to phase errors between said I and Q modulated carrier signal components, and means for providing a digital error correction signal derived from said amplitude compensation signal and said phase compensation signal to said I/Q digital encoder means to correct said amplitude and phase differences.

2. In a vector modulation system according to claim 1, said tuning means further including a processor means having a memory storage unit containing stored amplitude and phase compensation values wherein said processor means is responsive to said amplitude compensation signal generated in response to said power meter means for adjusting said stored amplitude compensation value to a new value corresponding to said amplitude compensation signal from said measured output power.

3. In a vector modulation system according to claim 2, said processor means also being responsive to said phase compensation signal generated in response to said power meter means for adjusting said stored phase compensation value to a new value corresponding to said phase compensation signal from said measured output power.

4. In a vector modulation system according to claim 3, wherein said new amplitude and phase compensation values are applied to said I/Q digital encoder means in said digital error correction signal to adjust said digital signals therefrom.

5. In a vector modulation system according to claim 4 wherein said errors in amplitude and phase produce a phase difference between said I an Q signal components other than 90 degrees, and wherein said amplitude and phase compensation values applied to said I/Q digital encoder means adjusts said digital signals to provide a 90 degree phase difference between said I and Q signal components.

6. In a vector modulation system according to claim 5 wherein said power meter means measures the said output power at a first frequency value and a second frequency value, wherein said means responsive to said power meter means for generating an amplitude compensation signal compares the amplitude level of said output power at said first and second frequencies, and wherein said amplitude compensation signal is generated in response to said comparison to adjust said digital signals from said I/Q encoder means to provide for a maximum achievable amplitude level difference between said output power at said first and second frequencies.

7. In a vector modulation system according to claim 6 wherein said phase compensation signal is generated after said amplitude compensation signal, also in response to comparison between said output power from said power meter means at said first and second frequencies to adjust said digital signals from said I/Q encoder means to provide for a further maximum achievable amplitude level difference between said output power of said first and second frequencies.

* * * * *